(12) United States Patent
Takahashi

(10) Patent No.: US 9,773,873 B1
(45) Date of Patent: Sep. 26, 2017

(54) SEMICONDUCTOR DEVICE

(71) Applicant: Mitsubishi Electric Corporation, Tokyo (JP)

(72) Inventor: Tetsuo Takahashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/353,826

(22) Filed: Nov. 17, 2016

(30) Foreign Application Priority Data

Mar. 18, 2016 (JP) .................. 2016-055103

(51) Int. Cl.
*H01L 21/02* (2006.01)
*H01L 29/10* (2006.01)
*H01L 29/16* (2006.01)
*H01L 29/20* (2006.01)
*H01L 29/739* (2006.01)
(Continued)

(52) U.S. Cl.
CPC ........ *H01L 29/1083* (2013.01); *H01L 21/046* (2013.01); *H01L 21/0415* (2013.01); *H01L 21/26546* (2013.01); *H01L 21/3245* (2013.01); *H01L 29/1095* (2013.01);
(Continued)

(58) Field of Classification Search
CPC ... H01L 29/1095; H01L 29/32; H01L 21/263; H01L 29/7395; H01L 29/7397; H01L 29/861; H01L 2924/0002; H01L 29/36; H01L 29/66333; H01L 29/66348; H01L 2924/00; H01L 29/868; H01L 21/02304
USPC ........... 257/139, 109, 655, E21.09, E21.135, 257/E21.162, E21.335, E21.383, E29.002, 257/E29.066, E29.107, E29.146, E29.19, 257/E29.197, E29.198, 329, 493, 590,
(Continued)

(56) References Cited

U.S. PATENT DOCUMENTS 6,482,681 B1* 11/2002 Francis ............ H01L 21/26506
257/E21.162
7,538,412 B2 5/2009 Schulze et al.
(Continued)

FOREIGN PATENT DOCUMENTS

JP 4128777 B2 7/2008
JP 2013-138172 A 7/2013
(Continued)

OTHER PUBLICATIONS

International Search Report issued in PCT/JP2013/076434; mailed Nov. 5, 2013.

*Primary Examiner* — Edward Chin
(74) *Attorney, Agent, or Firm* — Studebaker & Brackett PC

(57) ABSTRACT

A semiconductor device includes a substrate having an upper surface layer of a second conduction type formed at an upper surface side, a drift layer of a first conduction type formed under the upper surface layer, a buffer layer of the first conduction type formed under the drift layer, and a lower surface layer of the second conduction type formed under the buffer layer, the buffer layer includes a plurality of upper buffer layers provided apart from each other, and a plurality of lower buffer layers provided apart from each other between the plurality of upper buffer layers and the lower surface layer, wherein the plurality of upper buffer layers are formed so that average impurity concentrations in first sections each extending from the upper end of one of the upper buffer layers to the next lower buffer layer are unified as a first concentration.

20 Claims, 18 Drawing Sheets

(51) Int. Cl.
*H01L 21/04* (2006.01)
*H01L 21/265* (2006.01)
*H01L 21/324* (2006.01)

(52) U.S. Cl.
CPC ...... *H01L 29/1602* (2013.01); *H01L 29/1608* (2013.01); *H01L 29/2003* (2013.01); *H01L 29/7397* (2013.01)

(58) Field of Classification Search
USPC ........ 257/592, 593; 438/138, 137, 350, 478, 438/511, 520, 528, 530
See application file for complete search history.

(56) References Cited

U.S. PATENT DOCUMENTS

| | | | |
|---|---|---|---|
| 2012/0267681 A1* | 10/2012 | Nemoto | H01L 21/263 257/139 |
| 2014/0246750 A1* | 9/2014 | Takishita | H01L 21/263 257/493 |
| 2014/0299915 A1 | 10/2014 | Kouno et al. | |
| 2015/0179441 A1* | 6/2015 | Onozawa | H01L 29/36 257/109 |

FOREIGN PATENT DOCUMENTS

| | | |
|---|---|---|
| JP | 2014-099643 A | 5/2014 |
| JP | 2015-130523 A | 7/2015 |
| WO | 2014-065080 A1 | 5/2014 |

\* cited by examiner

US 9,773,873 B1

SEMICONDUCTOR DEVICE

BACKGROUND OF THE INVENTION

Field

The present invention relates to a semiconductor device used, for example, for switching of a large current.

Background

JP 2015-130523A discloses an arrangement having, at a position in a drift layer remote from a voltage-withstanding main junction in an insulated gate bipolar transistor (IGBT) or a diode, a field stop layer of the same conduction type as that of the drift layer and having an impurity concentration higher than that in the drift layer. The provision of the field stop structure enables inhibition of a depletion layer extending from the voltage-withstanding main junction at the time of turning off the semiconductor device and, hence, prevention of punch-through.

With respect to a semiconductor device called a power device, there are various requirements for reducing a loss, securing withstand voltage maintenance ability, securing a safe operation region for avoiding breakdown of the semiconductor device during operation, etc. Devices reduced in size and weight have been developed by satisfying such requirements. In recent years, a demand has arisen for electromagnetic compatibility (EMC) in addition to the above-described requirements. A power device that repeats switching of a high voltage and a large current can be an electromagnetic noise generation source. There is a demand for techniques to inhibit the influence of electromagnetic noise from such a noise generation source on other devices by suppressing the electromagnetic noise. One of measures to inhibit the electromagnetic noise is prevention of ringing at the time of turning off the semiconductor device.

SUMMARY OF THE INVENTION

In view of the above-described circumstances, an object of the present invention is to provide a semiconductor device capable of inhibiting ringing at the time of turning off.

The features and advantages of the present invention may be summarized as follows.

According to one aspect of the present invention, a semiconductor device includes a substrate having an upper surface layer of a second conduction type formed at an upper surface side, a drift layer of a first conduction type formed under the upper surface layer, a buffer layer of the first conduction type formed under the drift layer, and a lower surface layer of the second conduction type formed under the buffer layer, the buffer layer includes a plurality of upper buffer layers provided apart from each other, and a plurality of lower buffer layers provided apart from each other between the plurality of upper buffer layers and the lower surface layer, wherein the plurality of upper buffer layers are formed so that average impurity concentrations in first sections each extending from the upper end of one of the upper buffer layers to the next lower buffer layer are unified as a first concentration, the plurality of lower buffer layers are formed so that average impurity concentrations in second sections each extending from the upper end of one of the lower buffer layers to the next lower buffer layer are equal to or higher than the first concentration, and the plurality of lower buffer layers are formed so that an average impurity concentration in a lower one of the second sections is equal to or higher than an average impurity concentration in an upper one of the second sections.

Other and further objects, features and advantages of the invention will appear more fully from the following description.

DETAILED DESCRIPTION OF THE PREFERRED EMBODIMENTS

Figure 1:
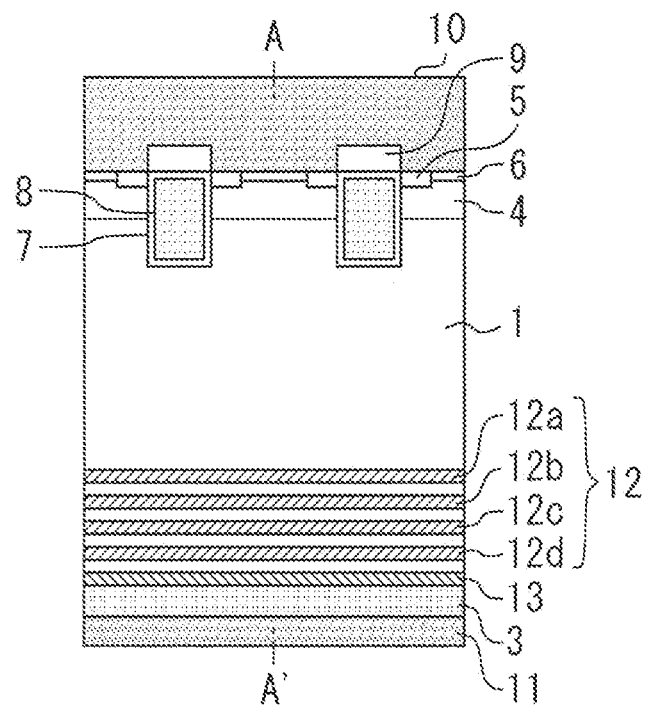
FIG. 1 is a sectional view of a semiconductor device according to a first embodiment.

A semiconductor device according to embodiments of the present invention will be described with reference to the accompanying drawings. Components identical or corresponding to each other are assigned the same reference characters, and repeated description of them is avoided in some cases. As occasion demands, n-type is referred to as "first conduction type", and p-type as "second conduction type.

First Embodiment

FIG. 1 is a sectional view of a semiconductor device according to a first embodiment. The semiconductor device has a drift layer 1 formed of an n$^-$-layer. An upper surface layer 4 of the second conduction type is formed on the drift layer 1. The upper surface layer 4 is a p-base layer. An emitter layer 5 of the first conduction type and a contact layer 6 of the second conduction type are formed on the upper surface layer 4. The emitter layer 5 is an n$^+$-type layer, while the contact layer 6 is a p$^+$-type layer.

Trenches are formed at the upper surface side of the substrate. Gate oxide film 7 is formed along inner wall surfaces of each trench. A gate electrode 8 formed, for example, of polysilicon is provided in contact with the gate oxide film 7. An emitter electrode 10 is formed on the upper surface of the substrate. An interlayer insulating film 9 is formed between the emitter electrode 10 and the gate electrode 8.

The upper surface layer 4 is thus formed at the upper surface side of the substrate. The drift layer 1 is formed under the upper surface layer 4. A buffer layer 12 of the first conduction type is formed under the drift layer 1. The buffer layer 12 includes upper buffer layers 12a and 12b and lower buffer layers 12c and 12d. A lower surface layer 3 of the second conduction type is formed under the buffer layer 12. The lower surface layer 3 is a collector layer. A punch-through prevention layer 13 of the first conduction type is formed between the buffer layer 12 and the lower surface layer 3. The punch-through prevention layer 13 is in contact with the lower surface layer 3 but is not in contact with the buffer layer 12. A collector electrode 11 is formed under the lower surface layer 3. The drift layer 1, the upper surface layer 4, the emitter layer 5, the gate oxide film 7 and the gate electrode 8 constitute a trench-type MOSFET.

Figure 2:
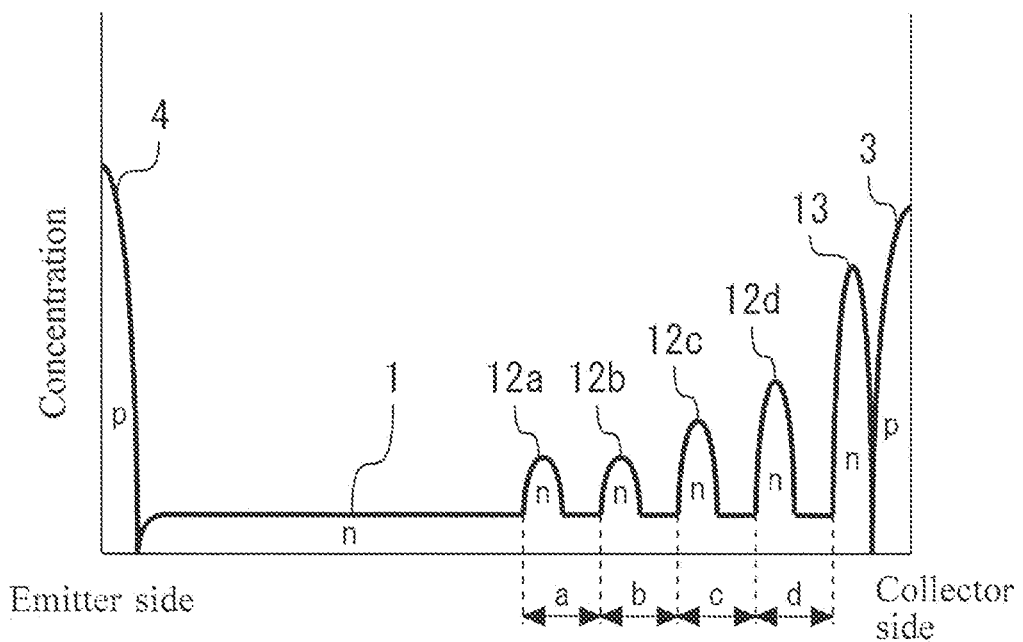
FIG. 2 is a diagram showing an impurity profile.

FIG. 2 is a diagram showing an impurity profile along line A-A' in FIG. 1. A first section a is a section from the upper end of the upper buffer layer 12a to the upper buffer layer 12b under the upper buffer layer 12a. A first section b is a section from the upper end of the upper buffer layer 12b to the lower buffer layer 12c under the upper buffer layer 12b. The average impurity concentration of an impurity of the first conduction type in the first section a and the average impurity concentration of the impurity of the first conduction type in the first section b are equal to each other. The average impurity concentration is referred to as "first concentration".

Thus, the upper buffer layers 12a and 12b are formed so that the average impurity concentration in the first section a from the upper end of the upper buffer layer 12a to the upper buffer layer 12b under the upper buffer layer 12a and the average impurity concentration in the first section b from the upper end of the upper buffer layer 12b to the lower buffer layer 12c are unified as the first concentration. As is apparent from FIG. 2, the two upper buffer layers 12a and 12b having peak concentrations equal to each other constitute a plurality of upper buffer layers.

A second section c is a section from the upper end of the lower buffer layer 12c to the lower buffer layer 12d under the lower buffer layer 12c. A second section d is a section from the upper end of the lower buffer layer 12d to the punch-through prevention layer 13 under the lower buffer layer 12d. The lower buffer layers 12c and 12d are formed so that each of the average impurity concentrations in second sections c and d is equal to or higher than the first concentration, and so that the average impurity concentration in the lower second section is equal to or higher than the average impurity concentration in the upper second section. FIG. 2 shows a state where the average impurity concentration in the lower second section, i.e., the second section d, is higher than the average impurity concentration in the upper second section, i.e., the second section c.

The impurity concentration in the punch-through prevention layer 13 is higher than any of those in the upper buffer layers 12a and 12b and the lower buffer layers 12c and 12d. The punch-through prevention layer 13 has P as an impurity.

Figure 3:
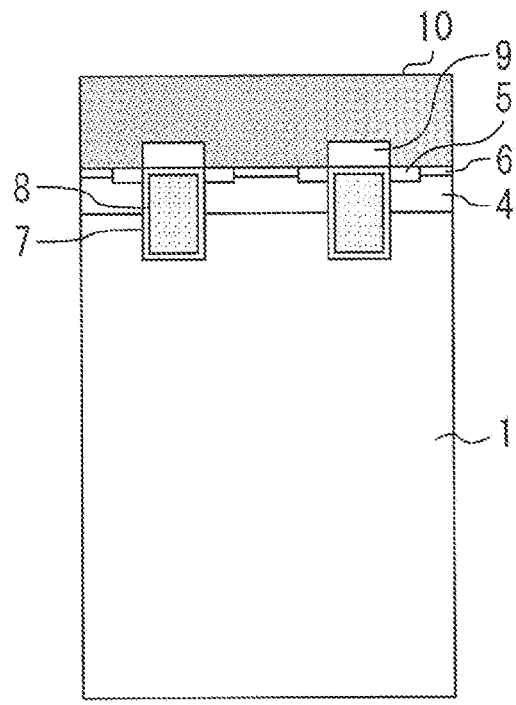
FIG. 3 is a diagram showing a method of manufacturing a semiconductor device.
Figure 4:
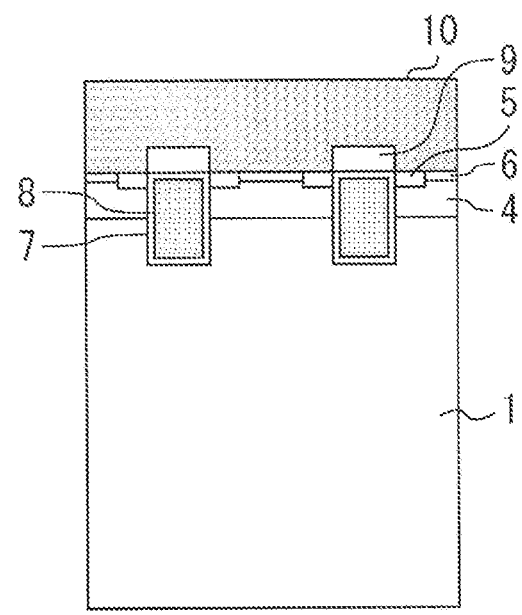
FIG. 4 is a diagram showing a method of manufacturing a semiconductor device.
Figure 5:
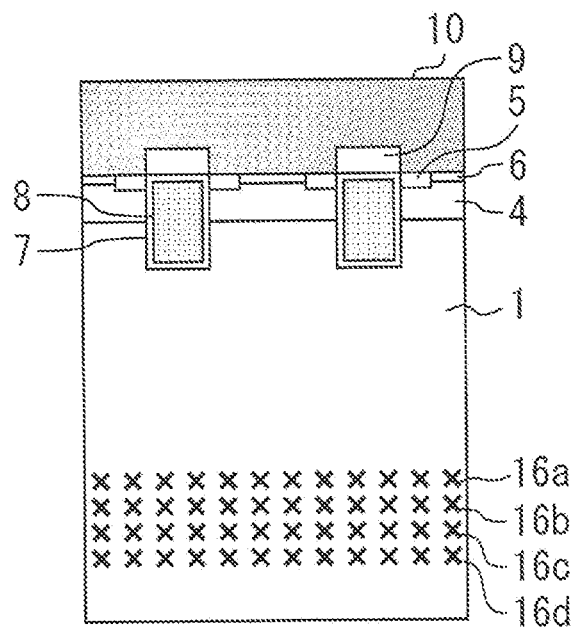
FIG. 5 is a diagram showing a method of manufacturing a semiconductor device.

A method of manufacturing the semiconductor device according to the first embodiment will be described. First, as shown in FIG. 3, the structure at the upper surface side of the substrate is formed by ordinary semiconductor manufacturing techniques. Next, as shown in FIG. 4, the substrate is ground from the lower surface of the substrate to a predetermined thickness. Subsequently, as shown in FIG. 5, proton implantation is performed on the substrate to form proton-implanted regions 16a, 16b, 16c and 16d at predetermined positions in the substrate.

Figure 6:
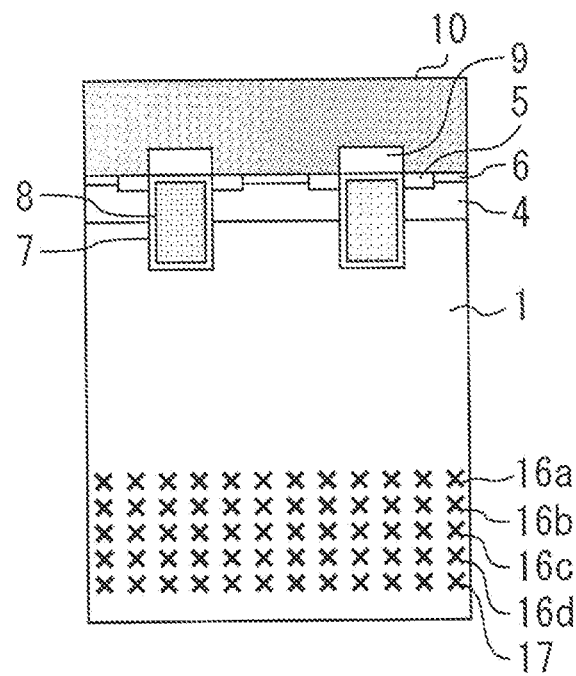
FIG. 6 is a diagram showing a method of manufacturing a semiconductor device.
Figure 7:
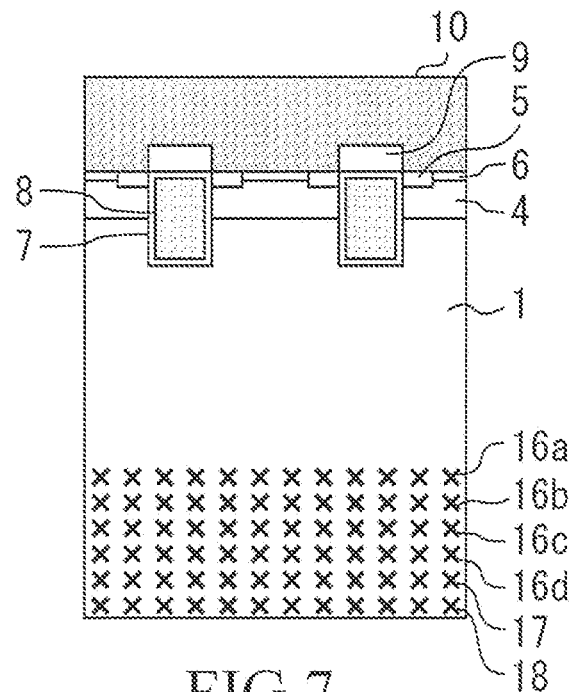
FIG. 7 is a diagram showing a method of manufacturing a semiconductor device.

Subsequently, as shown in FIG. 6, the substrate is implanted with P to form P-implanted region 17 at a predetermined position in the substrate. For implantation with P, an ordinary implantation technique is used. Subsequently, as shown in FIG. 7, a region 18 implanted with a p-type impurity is formed at a predetermined position in the substrate. The p-type impurity is, for example, B.

Figure 8:
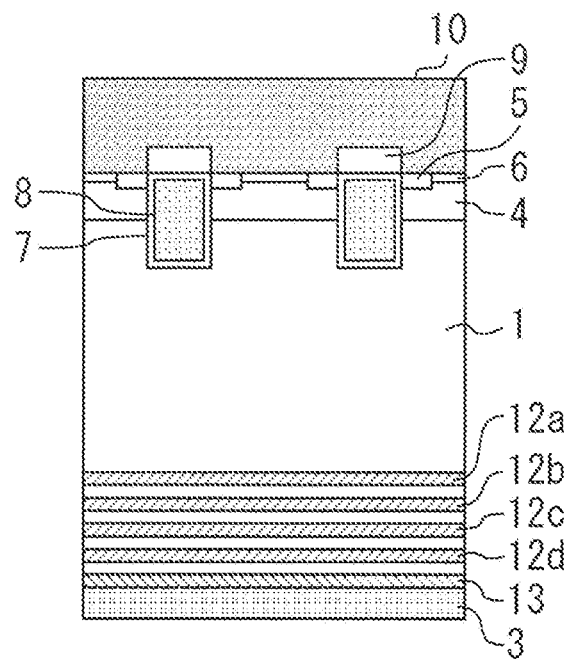
FIG. 8 is a diagram showing a method of manufacturing a semiconductor device.

The entire substrate is then annealed to activate the proton-implanted regions 16a, 16b, 16c, and 16d and the implanted regions 17 and 18. By this activation, the upper buffer layers 12a and 12b, the lower buffer layers 12c and 12d, the punch-through prevention layer 13 and the lower surface layer 3 are formed, as shown in FIG. 8. Thereafter, the semiconductor device shown in FIG. 1 is manufactured by making use of ordinary semiconductor manufacturing techniques.

Figure 30:
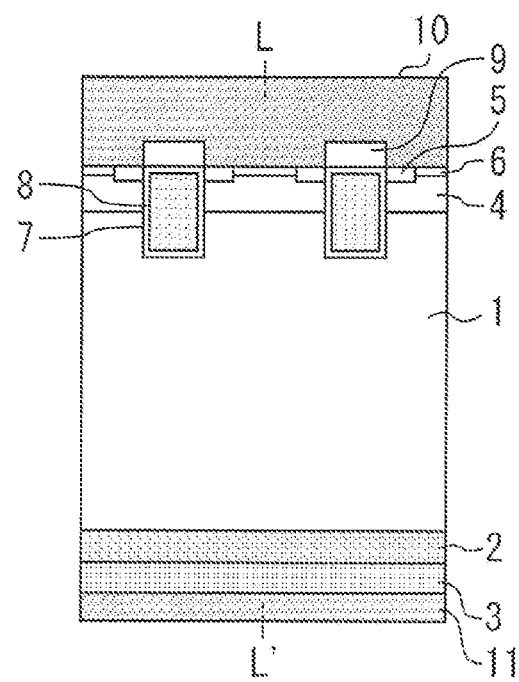
FIG. 30 is a sectional view of a semiconductor device according to a first comparative example.
Figure 31:
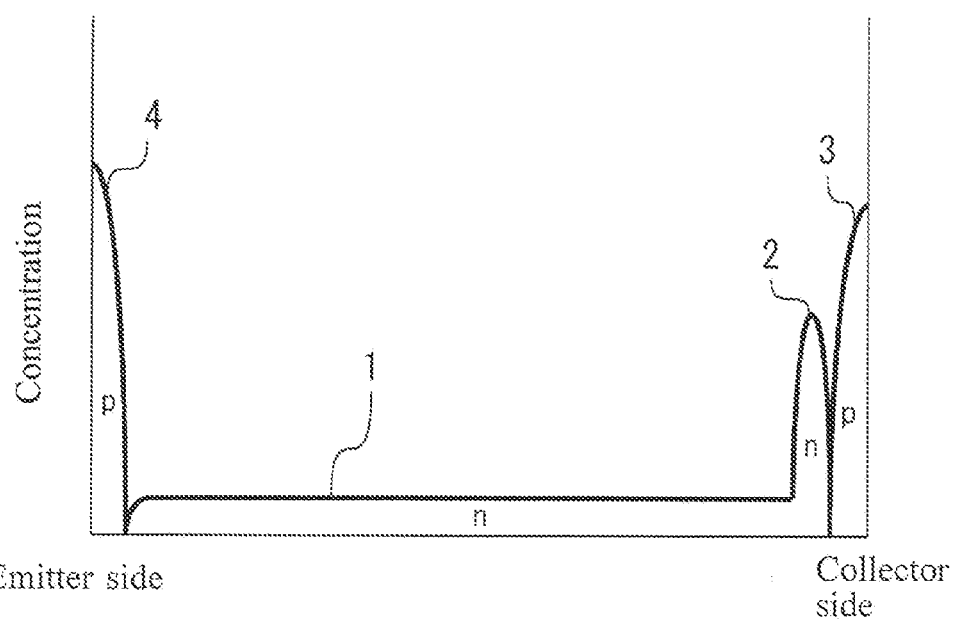
FIG. 31 is a diagram showing an impurity profile of the first comparative example.

To facilitate understanding of the features of the semiconductor device according to the first embodiment of the present invention, comparative examples will be described below. FIG. 30 is a sectional view of an IGBT according to a first comparative example. The IGBT according to the first comparative example has a buffer layer 2. The buffer layer 2 is in contact with the lower surface layer 3. FIG. 31 is a diagram showing an impurity profile along line L-L' in FIG. 30. One buffer layer 2 is in contact with the lower surface layer 3.

When the IGBT is in the on state, the MOSFET is in the on state and, therefore, a multiplicity of carriers accumulated by conductiFFFvity modulation exist in the drift layer 1. When the MOSFET is turned off, the carriers are gradually discharged from the emitter side at the upper surface of the substrate, the depletion layer extends in the drift layer 1 and the collector voltage rises. When discharge of the carriers in the drift layer 1 ends, the turning-off process ends.

Figure 32:
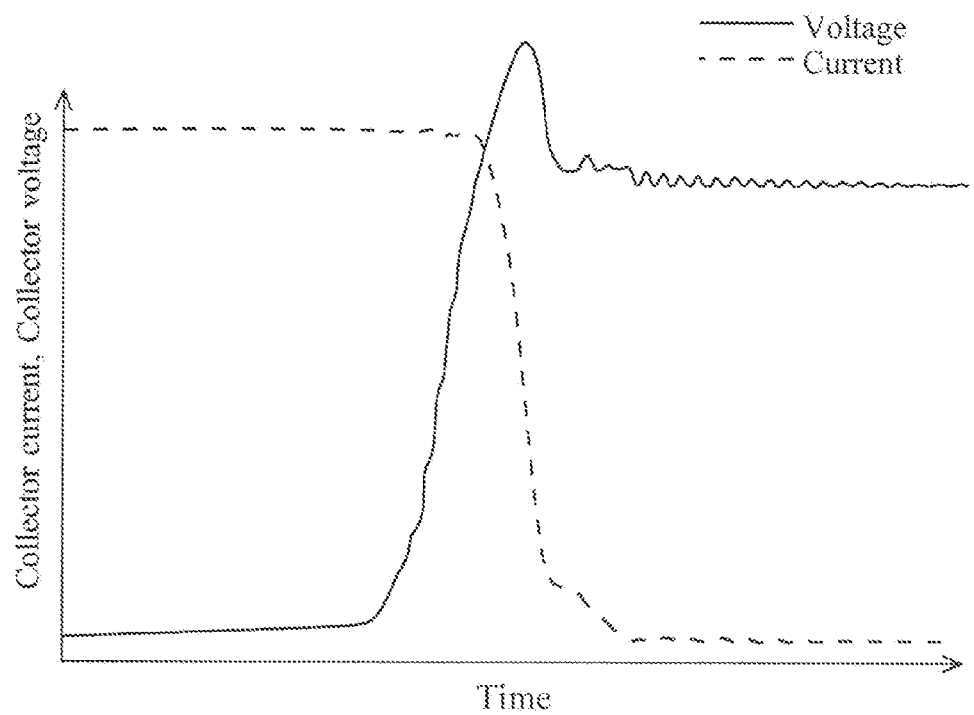
FIG. 32 is diagram showing a ringing waveform.

In the case of the first comparative example, there is a possibility of the depletion layer reaching the lower surface layer 3 and stopping further extension in the turning-off process. When the depletion layer reaches the lower surface layer 3, an oscillation waveform such as shown in FIG. 32 is observed. This oscillation waveform is called ringing. Ringing can be a cause of noise or a malfunction of the semiconductor device. If the thickness of the drift layer 1 is reduced or the drive voltage Vcc is increased, ringing becomes considerable.

Figure 33:
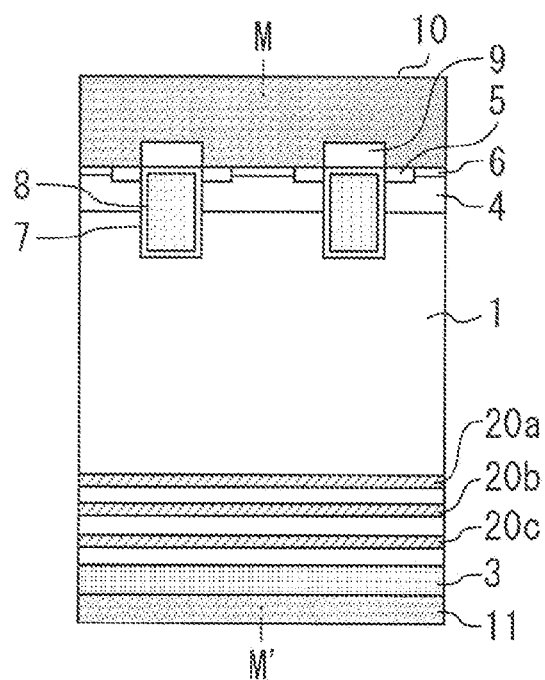
FIG. 33 is a sectional view of a semiconductor device according to a second comparative example.
Figure 34:
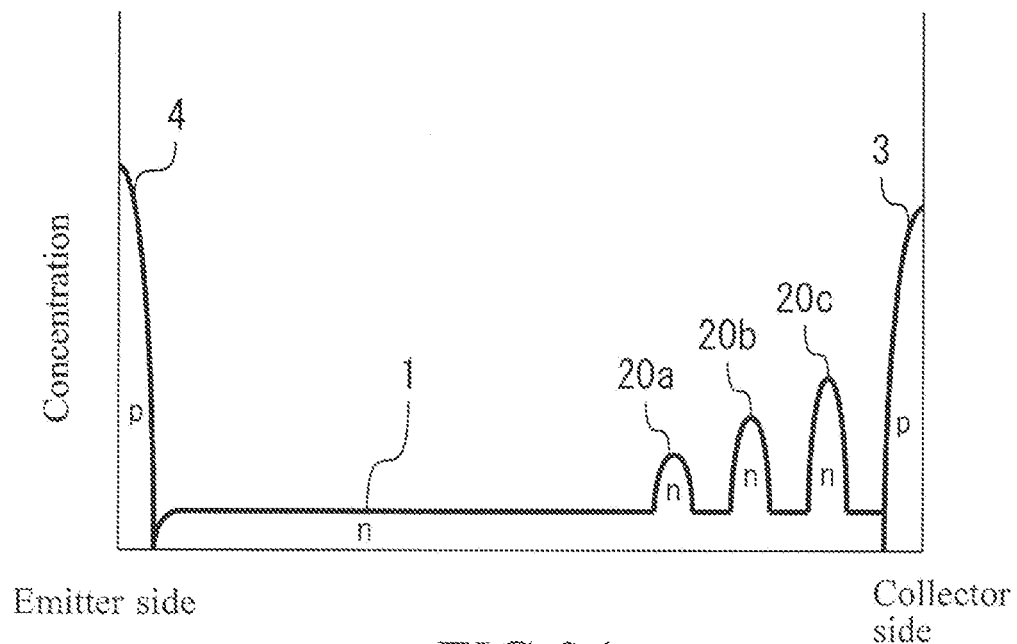
FIG. 34 is diagram showing a impurity profile of the second comparative example.

FIG. 33 is a sectional view of an IGBT according to a second comparative example, which has three buffer layers 20a, 20b, and 20c provided apart from each other. FIG. 34 is a diagram showing an impurity profile along line M-M' in FIG. 33. The impurity concentration in the buffer layer 20b is higher than that in the buffer layer 20a. The impurity concentration in the buffer layer 20c is higher than that in the buffer layer 20b. Thus, the plurality of buffer layers 20a, 20b, and 20c having the impurity concentration successively increased according to order of decreasing distance to the lower surface layer 3 are provided to moderate the extension of the depletion layer.

Figure 35:
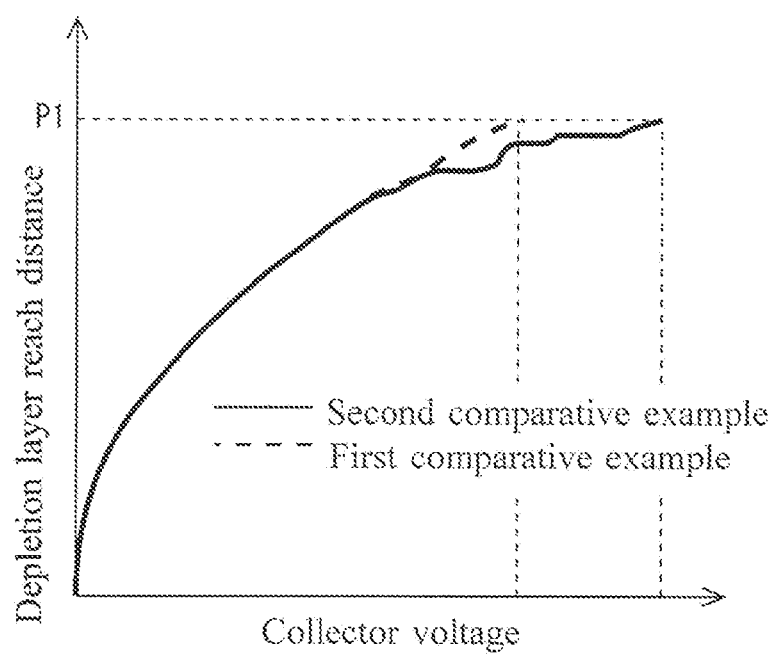
FIG. 35 is a diagram showing the relationship between the drain voltage and the length of the depletion layer of the first and second comparative example.

FIG. 35 is a diagram showing the relationship between the collector voltage and the depletion layer reach distance with respect to the semiconductor device according to the first comparative example and the semiconductor device according to the second comparative example. The depletion layer reach distance is the length of the depletion layer extending when the semiconductor device is turned off. P1 in FIG. 35 corresponds to the upper end of the lower surface layer 3. Therefore, ringing occurs when the waveform reaches P1. The collector voltage necessary for causing the depletion layer to reach the depletion layer reach distance P1 in the device according to the second comparative example is higher than that in the device according to the first comparative example. In use of the device according to the second comparative example, therefore, ringing can be inhibited while the collector voltage is increased to a high level.

In the case of the second comparative example, however, as can be understood from FIG. 35, the dependence of the depletion layer reach distance on the collector voltage becomes small in a certain region. That is, a region occurs where the waveform shown in FIG. 35 is flat, such that the depletion layer does not extend while the collector voltage is increased. Ringing occurs in such a region, where the waveform is flat.

The above-described waveform tends to become flat if the impurity concentration in the buffer layers is increased at an increasing rate according to order of decreasing distance to the lower surface side of the substrate, as in the second comparative example. In a case where a small number of buffer layers, e.g., about two to six layers are provided, the above-described flat waveform tends to occur. Increasing the number of buffer layers is effective in alleviating this problem but results in an increase in manufacturing cost.

The semiconductor device according to the first embodiment of the present invention is capable of solving the problem that the depletion layer easily reaches the lower surface layer as in the first comparative example, and is also capable of solving the problem that the waveform becomes flat as in the second comparative example. The buffer layer 12 according to the first embodiment is formed so as to satisfy Expression 1 below:

Average impurity concentration in first section $a \approx$ average impurity concentration in first section $b \leq$ average impurity concentration in second section $c \leq$ average impurity concentration in second section $d <$ average impurity concentration in punch-through prevention layer 13     Expression 1

That is, the average impurity concentration in the first section a and the average impurity concentration in the first section b are equal or nearly equal to each other. The average impurity concentration in the second section d is equal to or higher than the average impurity concentration in the second section c. The impurity concentration in the punch-through prevention layer 13 is higher than any of the impurity concentrations in the upper buffer layers 12a and 12b and the lower buffer layers 12c and 12d.

Figure 9:
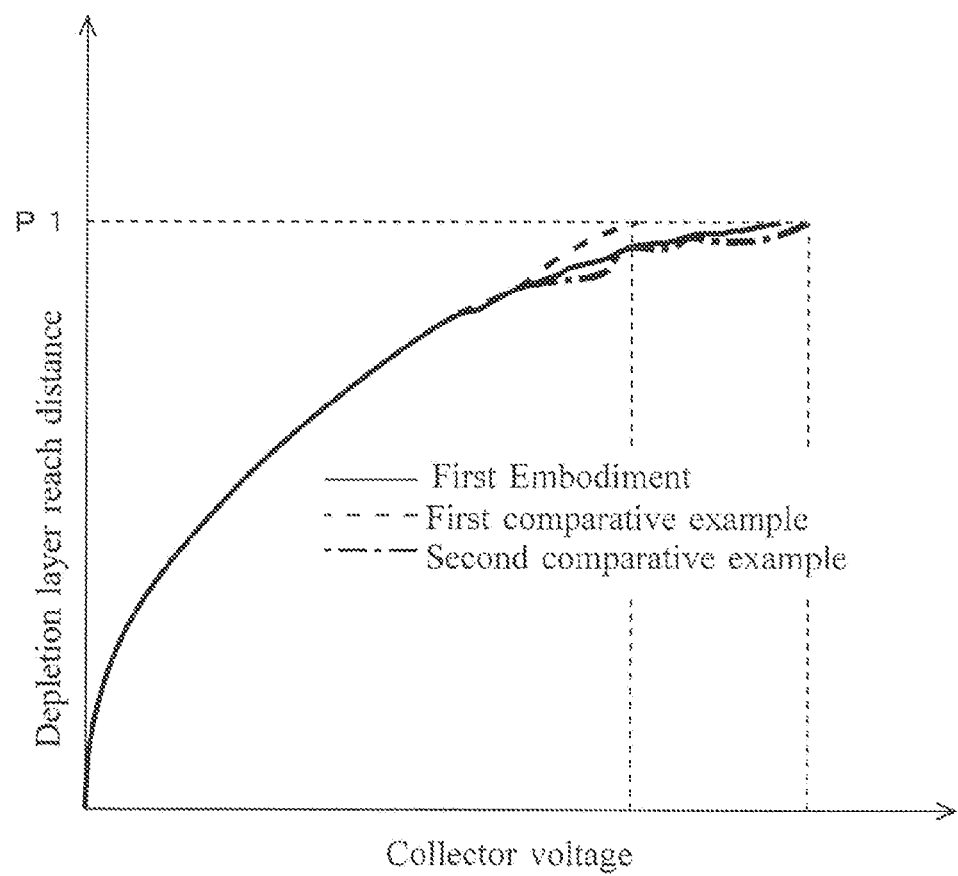
FIG. 9 is a diagram showing the relationship between the collector voltage and the length of the depletion layer.

FIG. 9 is a diagram in which the relationship between the collector voltage and the depletion layer reach distance in the semiconductor device according to the first embodiment is indicated by a solid line. In the case of the semiconductor device according to the first embodiment, the collector voltage at which the depletion layer reaches P1 can be increased to a level substantially equal to that in the second comparative example. Moreover, forming the two first sections a and b enables inhibiting the waveform from becoming flat. Ringing as a result of the reach of the depletion layer to the lower surface layer 3 and ringing as a result of flattening of the waveform can thus be inhibited.

The reason that ringing can be inhibited with the structure according to the first embodiment will be described. The average impurity concentrations in the first sections a and b are set slightly higher than the impurity concentration in the drift layer 1. As a result, depletion occurs in the first sections a and b when a certain voltage is applied. Since the average impurity concentrations in the first sections a and b are low, and since the average impurity concentrations in the first sections a and b are constant, the speed of development of the depletion layer is lower in the first sections a and b than in the drift layer 1. However, if the collector voltage is increased, the depletion layer reach distance increases with increase in collector voltage. That is, the waveform in the graph of FIG. 9 does not become flat.

The average impurity concentrations in the second sections c and d are set equal to or higher than those in the first sections a and b. Therefore, the speed of development of the depletion layer is lower in the second sections c and d than in the first sections a and b. In other words, the waveform in FIG. 9 becomes closer to a flat. However, since the two first sections a and b are provided to inhibit the extension of the depletion layer in comparison with the case where only one first section is provided, a comparatively low impurity concentration suffices as the average impurity concentrations in the second sections c and d. The waveform in the graph of FIG. 9 can thus be prevented from becoming flat.

The impurity concentrations in the upper buffer layers 12a and 12b and the lower buffer layers 12c and 12d are set to low concentrations but higher than the impurity concentration in the drift layer 1, such that the efficiency of injection of positive holes from the lower surface layer 3 is not reduced and Expression 1 shown above is satisfied. For example, in a semiconductor device of a withstand voltage 600 to 1200 V class, it is preferable to set the impurity concentrations in the upper buffer layers 12a and 12b and the lower buffer layers 12c and 12d lower than $1E15/cm^3$, even though these impurity concentrations are influenced by the concentration in the lower surface layer 3. By doing so, any considerable impediment to the development of the depletion layer at the time of turning off the semiconductor device can be avoided and a rise of the electric field at the substrate lower surface at the time of shorting can be limited.

It is preferable that one of the plurality of upper buffer layers formed closest to the upper surface layer 4 be formed at a position 10 μm or more deep from the lower surface layer 3. That is, the upper buffer layer 12a is formed at a distance of 10 μm or more from the lower surface layer 3 toward the upper surface layer 4. By doing so, ringing can be effectively inhibited. For example, an impurity concentration peak in the lower buffer layer 12d is formed at a position 2.5 μm deep from the lower surface layer 3; an impurity concentration peak in the lower buffer layer 12c, at a position 5.0 μm deep from the lower surface layer 3; an impurity concentration peak in the upper buffer layer 12b, at a position 7.5 μm deep from the lower surface layer 3; and an impurity concentration peak in the upper buffer layer 12a, at a position 10 μm deep from the lower surface layer 3.

An impurity concentration peak in the lower buffer layer 12d may alternatively be formed at a position 3.75 μm deep from the lower surface layer 3; an impurity concentration peak in the lower buffer layer 12c, at a position 7.5 μm deep from the lower surface layer 3; an impurity concentration peak in the upper buffer layer 12b, at a position 11.25 μm deep from the lower surface layer 3; and an impurity concentration peak in the upper buffer layer 12a, at a position 15 μm deep from the lower surface layer 3.

The punch-through prevention layer 13 is formed not for the purpose of preventing ringing but for the purpose of inhibiting an increase in leak current due to punch-through. The punch-through prevention layer 13 is formed so that the depletion layer does not reach the lower surface layer 3 even when the collector voltage is maximized. It is necessary to form the punch-through prevention layer 13 so that the efficiency of injection of positive holes from the lower surface layer 3 functioning as collector layer into the drift layer 1 is not considerably reduced. For example, if the peak concentration in the punch-through prevention layer 13 is set to about $5E17$ $cm^{-3}$ or less, the positive hole injection efficiency can be maintained while an increase in leak current is inhibited.

If the thickness of an effectively-functioning concentration portion of the punch-through prevention layer 13 is set to 1 μm or less, inhibition of the effect of the buffer layer 12 can be avoided. It is desirable to set the thickness of the lower surface layer 3 and the entire thickness of the wafer to minimum values necessary for maintaining the withstand voltage determined in advance according to FIG. 9 showing the relationship between the depletion layer reach distance and the collector voltage. Reductions in forward drop voltage (Vce(sat)) and turning-on and turning-off losses can thereby be achieved while ringing is prevented. Efficient donor formation can be enabled by forming the punch-through prevention layer 13 of P. A preferable characteristic can be obtained by forming the plurality of upper buffer layers 12a and 12b, for example, of a proton donor. The upper buffer layers can be formed at deeper positions by using proton. The lower buffer layers may also be formed of a proton donor.

In the semiconductor device according to the first embodiment, it is important that the plurality of first sections uniform in average impurity concentration be formed by the plurality of upper buffer layers provided apart from each other, and that the extension of the depletion layer be inhibited by the first sections. Also, the plurality of lower buffer layers provided apart from each other between the upper buffer layers 12a and 12b and the lower surface layer 3 are formed so that the average impurity concentration in the lower second section is equal to or higher than the average impurity concentration in the upper second section, thereby inhibiting punch-through. The semiconductor device according to the first embodiment of the present invention can be variously modified within a scope such as not to lose these features. For example, three or more upper buffer layers may be provided and three or more lower buffer layers may be provided.

The structure at the upper surface side of the substrate can be changed as desired. The plurality of upper buffer layers and the plurality of lower buffer layers may be formed by using an impurity other than proton. P is not exclusively used as an impurity in the punch-through prevention layer 13. The conduction types of the portions shown in FIG. 1 may be reversed. The type of the IGBT is not particularly specified. For example, a planar IGBT or a carrier stored trench gate bipolar transistor (CSTBT) which is an IGBT having a carrier storage layer, may be adopted. The withstand voltage class of the semiconductor device is not particularly specified.

The substrate may be formed of a wide-bandgap semiconductor instead of Si. The wide-bandgap semiconductor is, for example, silicon carbide, a gallium nitride-based material or diamond. A switching device or a diode device formed of such a wide-bandgap semiconductor has a high withstand voltage and a high allowable current density and can therefore be reduced in size. By using the switching device or a diode device reduced in size, a semiconductor module incorporating this kind of semiconductor device can be reduced in size.

Also, because the heat resistance of the wide-bandgap semiconductor is high, heat radiating fins of a heat sink can be reduced in size and a water cooling portion of the heat sink can be replaced with an air cooling portion, thus enabling the semiconductor module to be further reduced in size. Further, because the semiconductor has reduced power loss, the switching device or the diode device can be improved in efficiency, and the semiconductor module can also be improved in efficiency.

It is desirable that each of the switching device and the diode device be formed of the wide-bandgap semiconductor. However, only one of the devices may be formed of the wide-bandgap semiconductor.

These modifications can be applied as desired to semiconductor devices according to embodiments described below. Each of the semiconductor devices according to the embodiments described below satisfies Expression 1 shown above, has a number of commonalities with the first embodiment, and will therefore be described mainly with respect to points of difference from the first embodiment.

Second Embodiment

Figure 10:
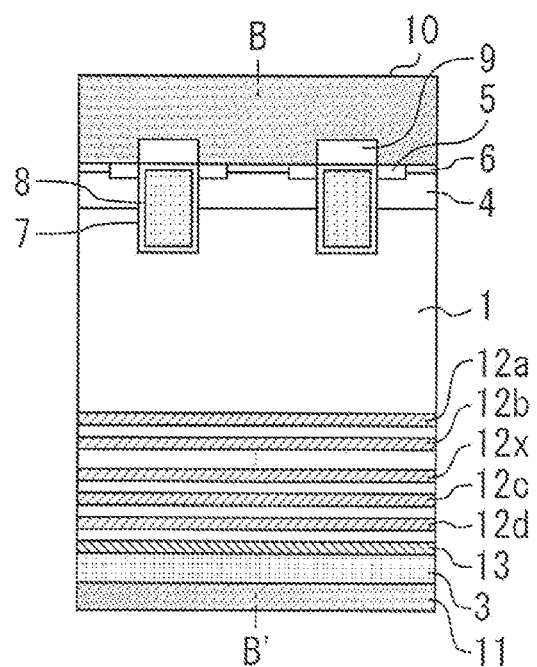
FIG. 10 is a sectional view of the semiconductor device according to a second embodiment.
Figure 11:
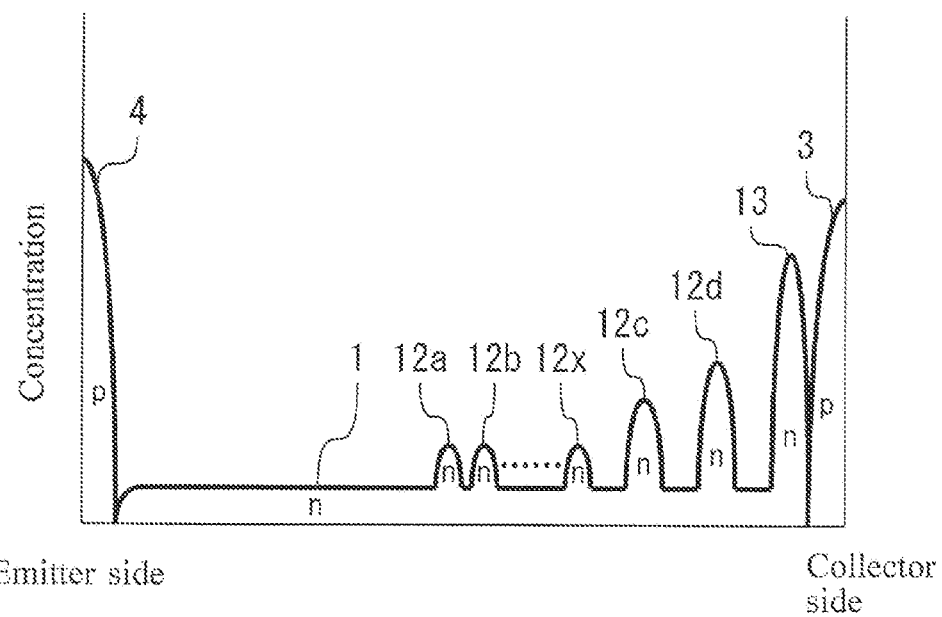
FIG. 11 is a diagram showing an impurity profile.

FIG. 10 is a sectional view of the semiconductor device according to a second embodiment. Three upper buffer layers 12a, 12b, and 12x are formed. A dotted line between the upper buffer layer 12b and the upper buffer layer 12x signifies that four or more upper buffer layers may be formed. FIG. 11 is a diagram showing an impurity profile along line B-B' in FIG. 10. Three or more upper buffer layers 12a, 12b, and 12x having peak concentrations equal to each other are formed as the plurality of upper buffer layers. Three or more first sections are formed. Accordingly, the total thickness of the first sections is increased relative to that in the first embodiment. As a result, the effect of inhibiting ringing when the collector voltage is increased can be improved.

The number of second sections may be increased by increasing the number of lower buffer layers. In such a case, an abrupt change in impurity concentration in the entire group of the second sections can be inhibited, thus preventing a flat waveform such as described above with reference to FIG. 9.

Third Embodiment

Figure 12:
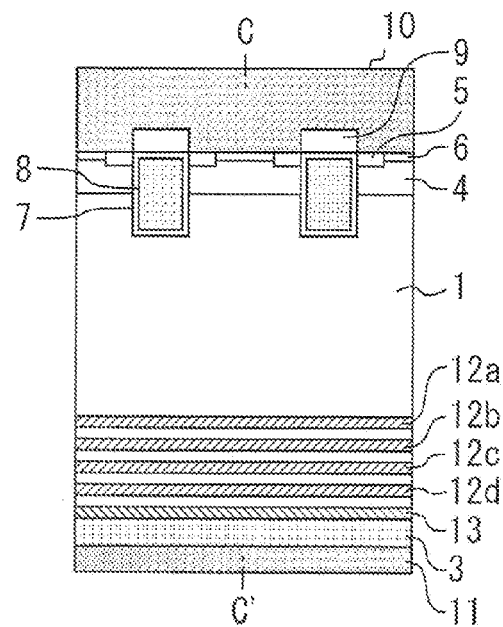
FIG. 12 is a sectional view of the semiconductor device according to a third embodiment.
Figure 13:
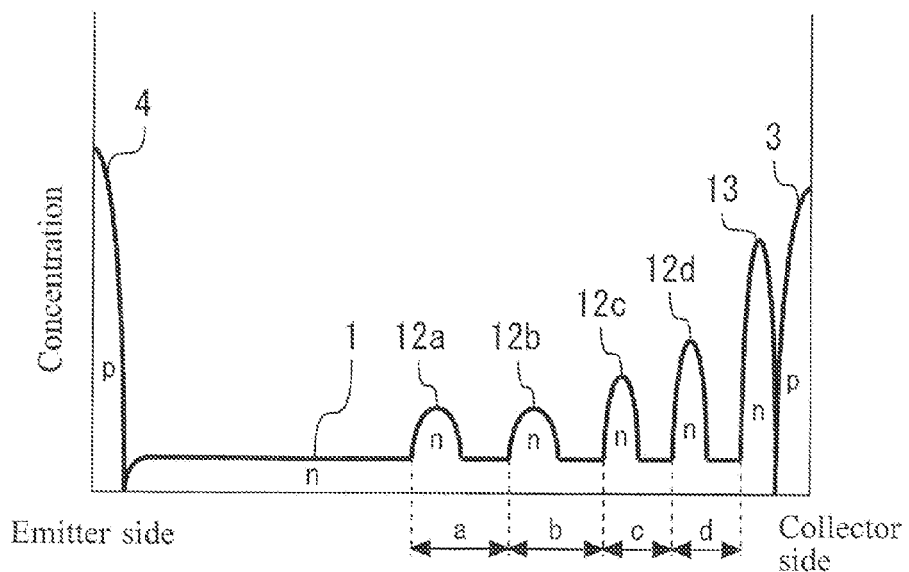
FIG. 13 is a diagram showing an impurity profile.

FIG. 12 is a sectional view of the semiconductor device according to a third embodiment. FIG. 13 is a diagram showing an impurity profile along line C-C' in FIG. 12. The upper buffer layers 12a and 12b formed in the first sections a and b have a lower concentration and a larger thickness relative to those of the lower buffer layers 12c and 12d formed in the second sections c and d. Concentration peaks in the upper buffer layers 12a and 12b can therefore be reduced. If the concentration peaks in the upper buffer layers 12a and 12b are reduced, the problem that the depletion layer reach distance is not increased in the first sections a and b when the collector voltage is increased can be avoided.

The thickness of the first section a is twice the thickness of the upper buffer layer 12a, and the thickness of the first section b is twice the thickness of the upper buffer layer 12b. With this arrangement, the differences in impurity concentration in the first sections a and b can be efficiently reduced respectively in comparison with the first embodiment. As a result, the problem that the depletion layer reach distance is not increased when the collector voltage is increased can be avoided. Also, forming a high-concentration portion due to the superposition of the upper buffer layers 12a and 12b can be inhibited.

Fourth Embodiment

Figure 14:
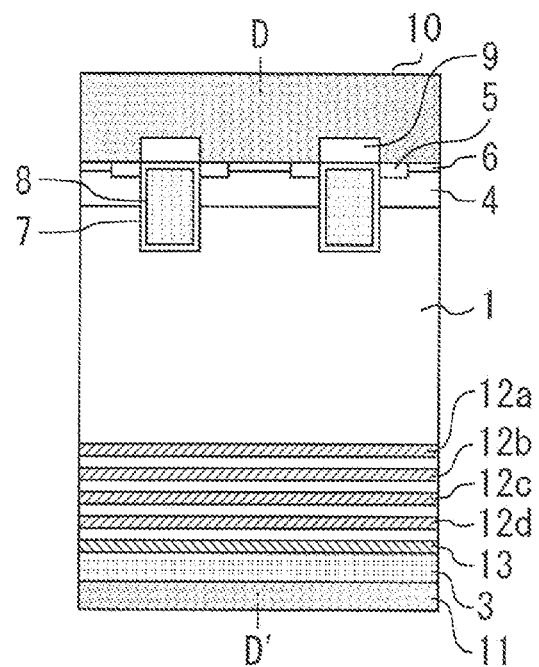
FIG. 14 is a sectional view of the semiconductor device according to a fourth embodiment.
Figure 15:
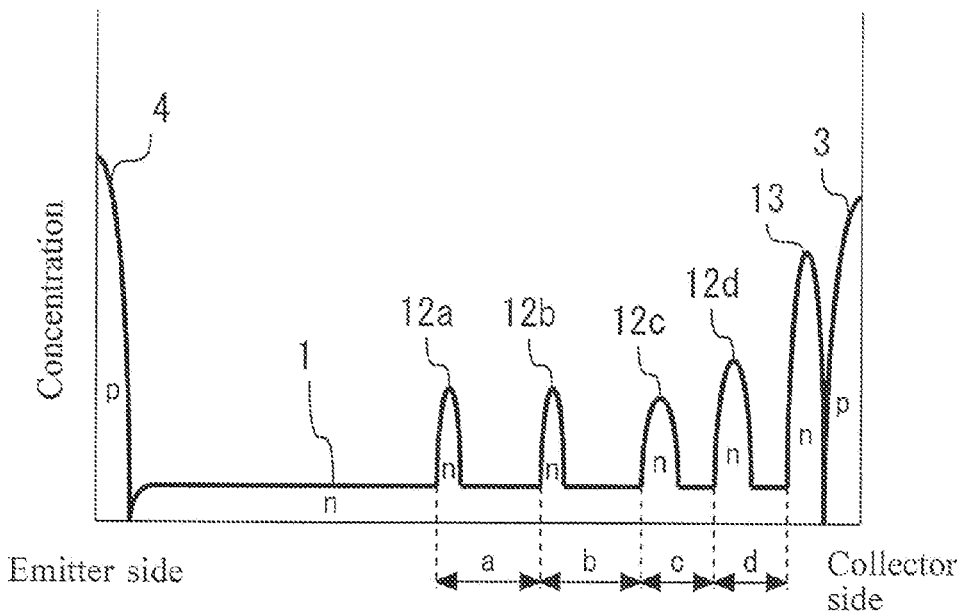
FIG. 15 is a diagram showing an impurity profile.

FIG. 14 is a sectional view of the semiconductor device according to a fourth embodiment. FIG. 15 is a diagram showing an impurity profile along line D-D' in FIG. 14. Peak concentrations in the upper buffer layers 12a and 12b are higher than a peak concentration in the lower buffer layer 12c. The higher peak concentrations can be realized by reducing the thicknesses of the upper buffer layers 12a and 12b.

Fifth Embodiment

Figure 16:
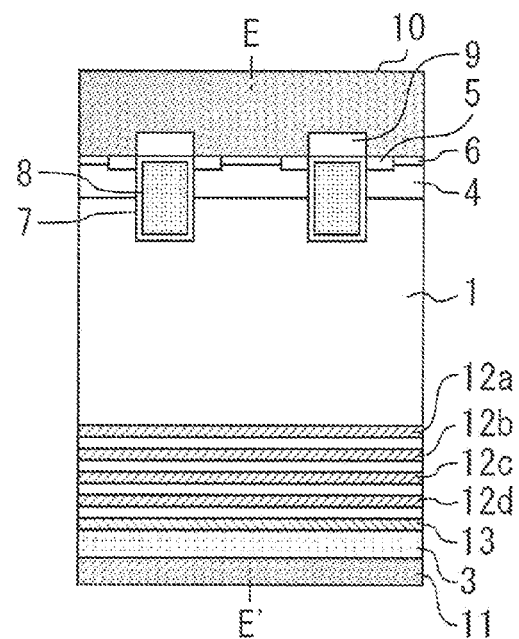
FIG. 16 is a sectional view of the semiconductor device according to a fifth embodiment.
Figure 17:
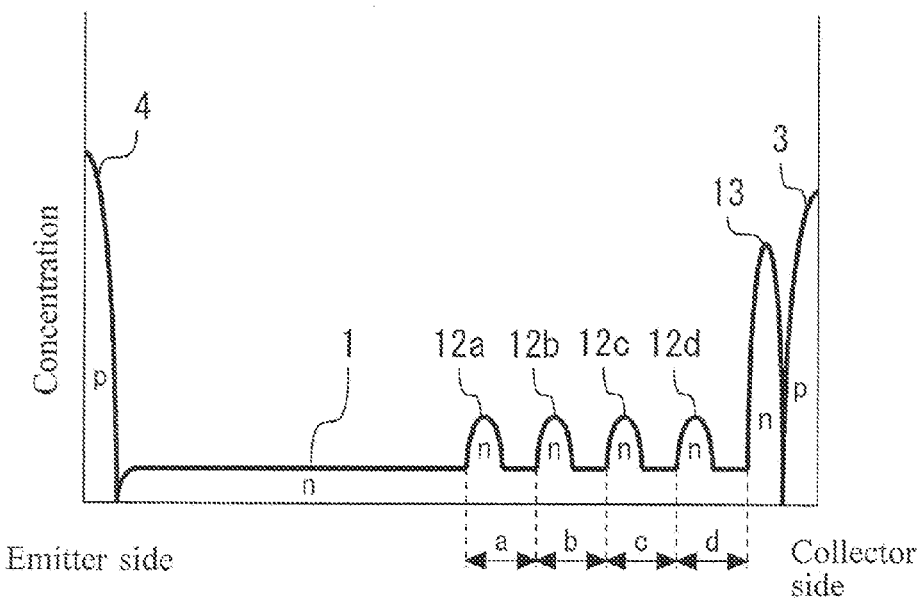
FIG. 17 is a diagram showing an impurity profile.

FIG. 16 is a sectional view of the semiconductor device according to a fifth embodiment. FIG. 17 is a diagram showing an impurity profile along line E-E' in FIG. 16. All the first sections a and b and the second sections c and d are formed so as to have average impurity concentrations equal to each other. Impurity peaks in the upper buffer layers 12a and 12b and the lower buffer layers 12c and 12d are made equal to each other in order to equalize the average impurity concentrations in all the sections. However, this may be achieved by a different method.

As a result of equalizing the average impurity concentrations in all the first and second sections, the maximum value of the collector voltage at or below which ringing due to punch-through does not occur is reduced in comparison with the first embodiment. However, the risk of occurrence of ringing at a particular voltage equal to or lower than the maximum value can be reduced. While the thicknesses of all the sections are equalized in the fifth embodiment, the thicknesses and peaks of the upper or lower buffer layers may be adjusted, for example, as in the third embodiment.

Sixth Embodiment

Figure 18:
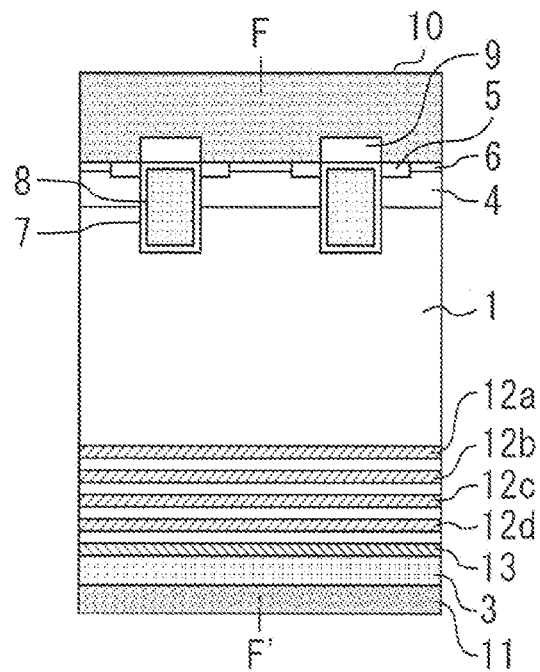
FIG. 18 is a sectional view of the semiconductor device according to a sixth embodiment.
Figure 19:
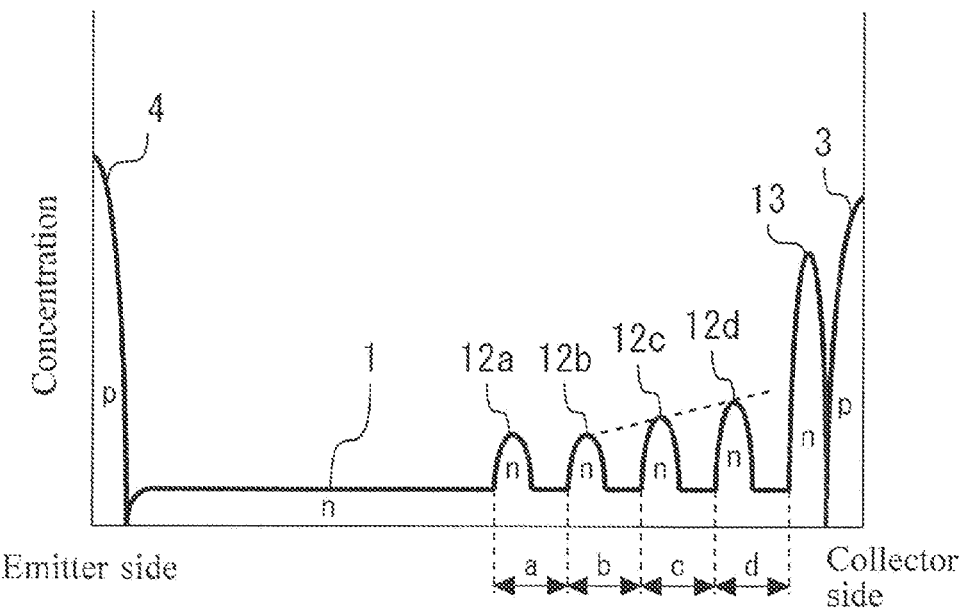
FIG. 19 is a diagram showing an impurity profile.

FIG. 18 is a sectional view of the semiconductor device according to a sixth embodiment. FIG. 19 is a diagram showing an impurity profile along line F-F' in FIG. 18. As shown in FIG. 19, the first section b at the lowermost position in the plurality of first sections and the second sections c and d are formed so that the average impurity concentrations therein are linearly increased along a direction toward the lower surface layer 3. Certain amounts of an impurity can thereby be secured in the first section b and the second sections c and d. The depletion layer can therefore be inhibited from reaching the lower surface layer when the collector voltage is somewhat high. Moreover, the depletion layer reach distance can be increased with increase in the collector voltage. Flattening at a particular collector voltage of the waveform shown in FIG. 9 can therefore be prevented.

Also, flattening in the first sections a and b of the waveform shown in FIG. 9 can be prevented by equalizing the average impurity concentrations in the first sections a and b, as described above in the description of the first embodiment. Further, it is preferable that the thicknesses of the first sections a and b be twice the thicknesses of the upper buffer layers 12a and 12b, respectively, and that the thicknesses of the second sections c and d be twice the thicknesses of the lower buffer layers 12c and 12d, respectively. The differences in impurity concentration in the sections can be reduced thereby to prevent flattening of the waveform shown in FIG. 9.

Seventh Embodiment

Figure 20:
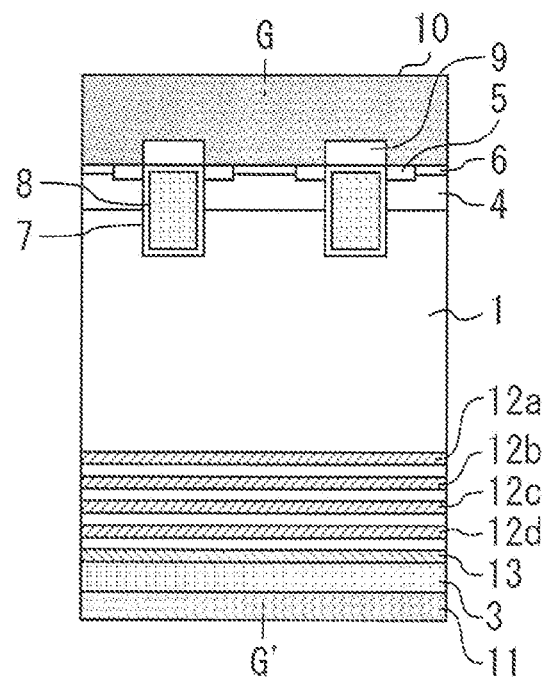
FIG. 20 is a sectional view of the semiconductor device according to a seventh embodiment.
Figure 21:
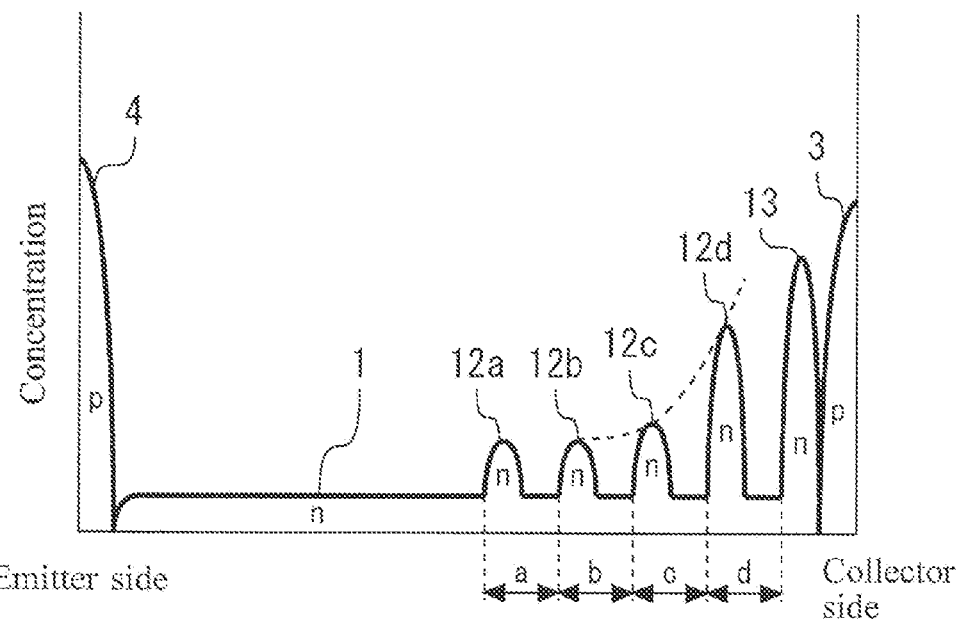
FIG. 21 is a diagram showing an impurity profile.

FIG. 20 is a sectional view of the semiconductor device according to a seventh embodiment. FIG. 21 is a diagram showing an impurity profile along line G-G' in FIG. 20. The first section b at the lowermost position in the plurality of first sections and the second sections c and d are formed so that the square of the average impurity concentration in one of the sections is the average impurity concentration in the next lower section. More specifically, the average impurity concentration in the second section c is a value obtained by squaring the average impurity concentration in the first section b, and the average impurity concentration in the second section d is a value obtained by squaring the average impurity concentration in the second section c.

That is, the first section b, the second section c and the second section d are formed so that the average impurity concentration changes in proportion to the square thereof, thereby preventing the occurrence of ringing in the first section b or the second section c or d when the collector voltage is high. The ringing inhibition effect is higher than that in the sixth embodiment.

Eighth Embodiment

Figure 22:
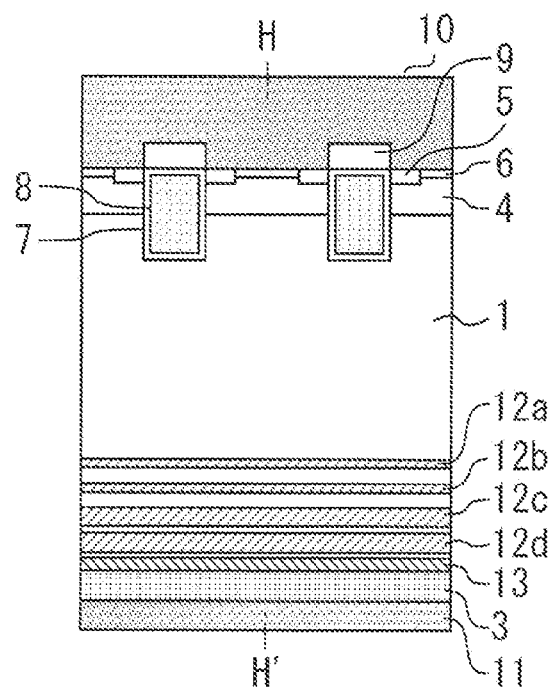
FIG. 22 is a sectional view of the semiconductor device according to an eighth embodiment.
Figure 23:
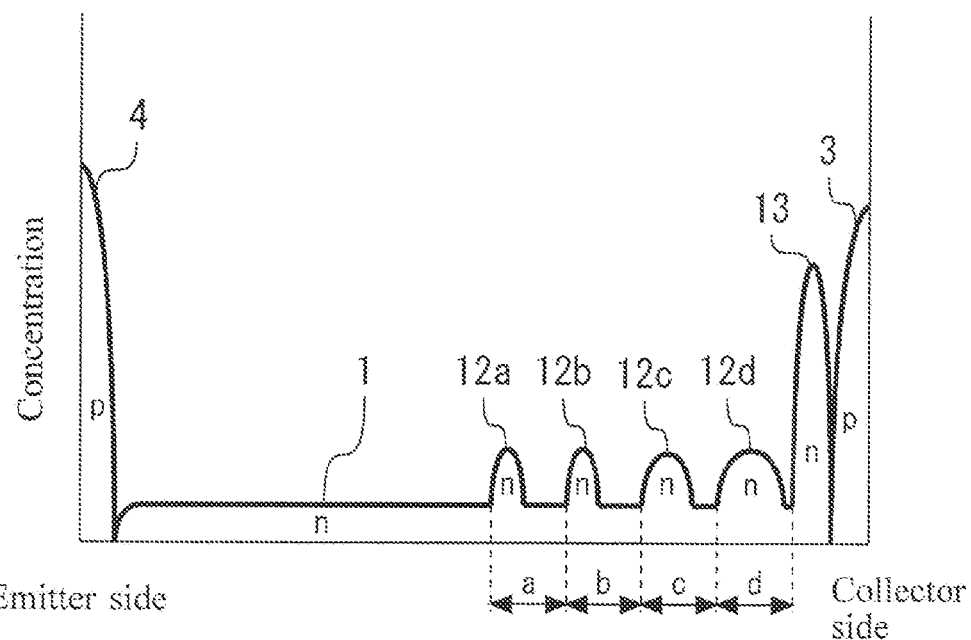
FIG. 23 is a diagram showing an impurity profile.

FIG. 22 is a sectional view of the semiconductor device according to an eighth embodiment. FIG. 23 is a diagram showing an impurity profile along line H-H' in FIG. 22. The lower buffer layers 12c and 12d are made larger in thickness according to order of decreasing distance to the lower surface layer 3. Accordingly, the thickness of the lower buffer layer 12d is larger than that of the lower buffer layer 12c. The average impurity concentration in the second section d is higher than the average impurity concentration in the second section c. Peak impurity concentrations in the upper buffer layer 12b and the lower buffer layers 12c and 12d are equal to each other.

The peak impurity concentration in the lower buffer layer 12d can be reduced in this way, thus enabling inhibition of a rise of the electric field at the substrate lower surface at the time of shorting while inhibiting ringing. If the peak impurity concentration in the lower buffer layer 12d can be sufficiently reduced, the thicknesses of the lower buffer layers 12c and 12d and impurity peaks in these layers, for example, may be separately adjusted by considering manufacturing conditions, etc.

Ninth Embodiment

Figure 24:
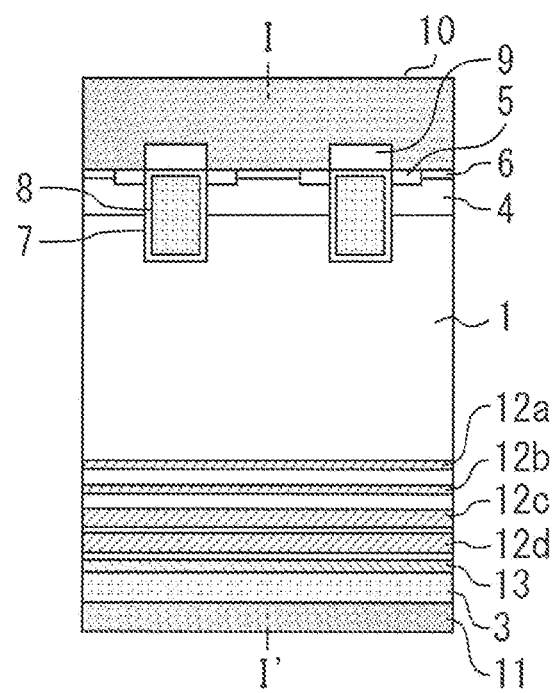
FIG. 24 is a sectional view of the semiconductor device according to a ninth embodiment.
Figure 25:
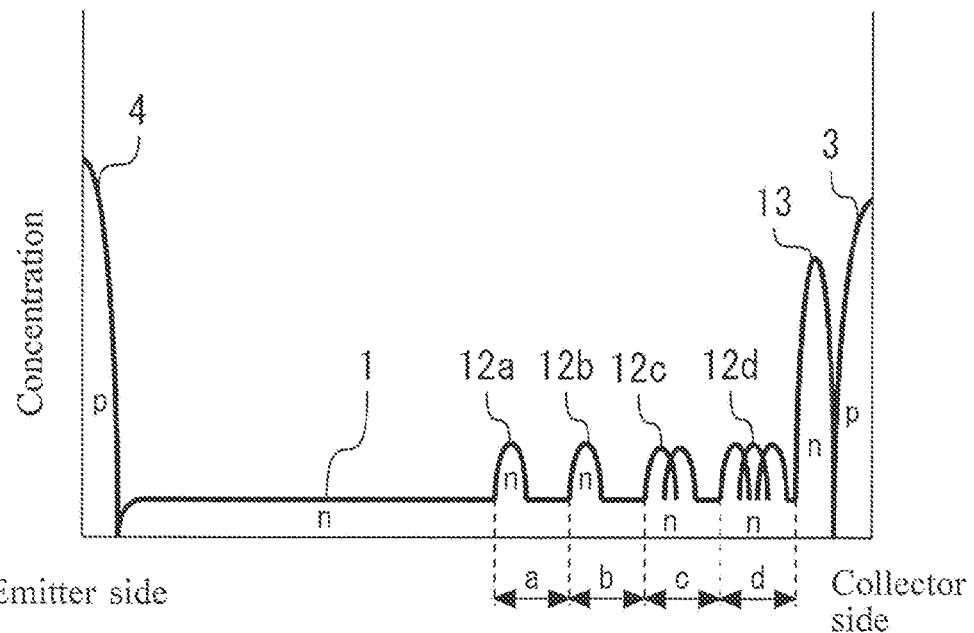
FIG. 25 is a diagram showing an impurity profile.

FIG. 24 is a sectional view of the semiconductor device according to a ninth embodiment. FIG. 25 is a diagram showing an impurity profile along line I-I' in FIG. 24. Each of the lower buffer layers 12c and 12d has a plurality of impurity concentration peaks. FIG. 25 shows a state where two impurity concentration peaks are provided in the lower buffer layer 12c by overlapping two impurity regions, and where three impurity concentration peaks are provided in the lower buffer layer 12d by overlapping three impurity regions.

If one lower buffer layer is formed by overlapping a plurality of impurity regions in this way, a lower buffer layer increased in thickness and having a low peak concentration can be easily formed. That is, the structure according to the eighth embodiment can easily be realized.

Tenth Embodiment

Figure 26:
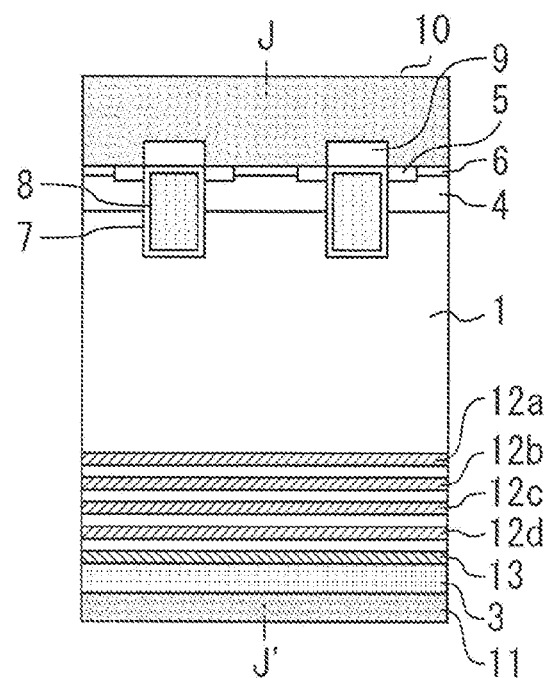
FIG. 26 is a sectional view of the semiconductor device according to a tenth embodiment.
Figure 27:
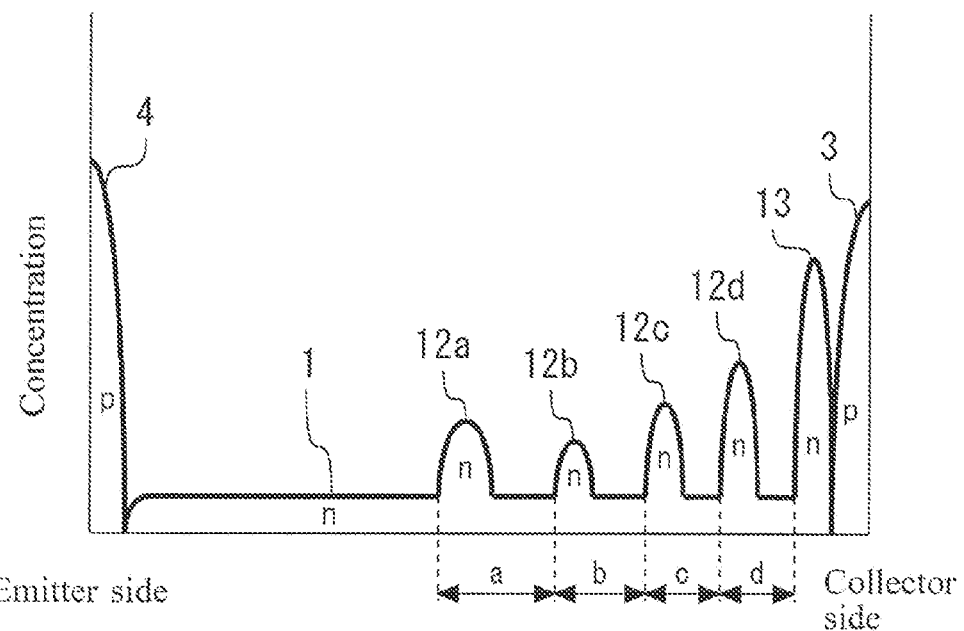
FIG. 27 is a diagram showing an impurity profile.

FIG. 26 is a sectional view of the semiconductor device according to a tenth embodiment. FIG. 27 is a diagram showing an impurity profile along line J-J' in FIG. 26. The upper buffer layer 12a on the upper surface layer 4 side in the two upper buffer layers 12a and 12b is formed thicker than the upper buffer layer 12b on the lower surface layer 3 side. That is, the plurality of upper buffer layers are successively made thicker according to order of decreasing distance to the upper surface layer. The impurity concentration in the upper buffer layer 12a on the upper surface layer 4 side is higher than that in the upper buffer layer 12b on the lower surface layer 3 side.

Forming the upper buffer layer on the upper surface layer side requires implanting an impurity with high energy from the lower surface of the substrate. When implantation of an impurity is performed with high energy, additional annealing is required for defect recovery or the like. Therefore the upper buffer layer 12a has an increased half-width in comparison with the upper buffer layer 12b. Even in such a case, ringing can be inhibited by making concentration adjustments such that Expression 1 shown above is satisfied.

Eleventh Embodiment

Figure 28:
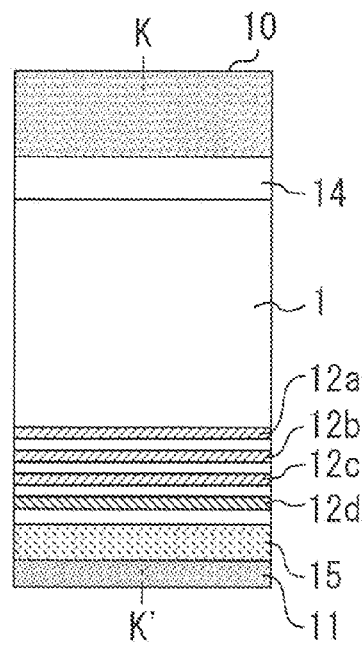
FIG. 28 is a sectional view of the semiconductor device according to a eleventh embodiment.
Figure 29:
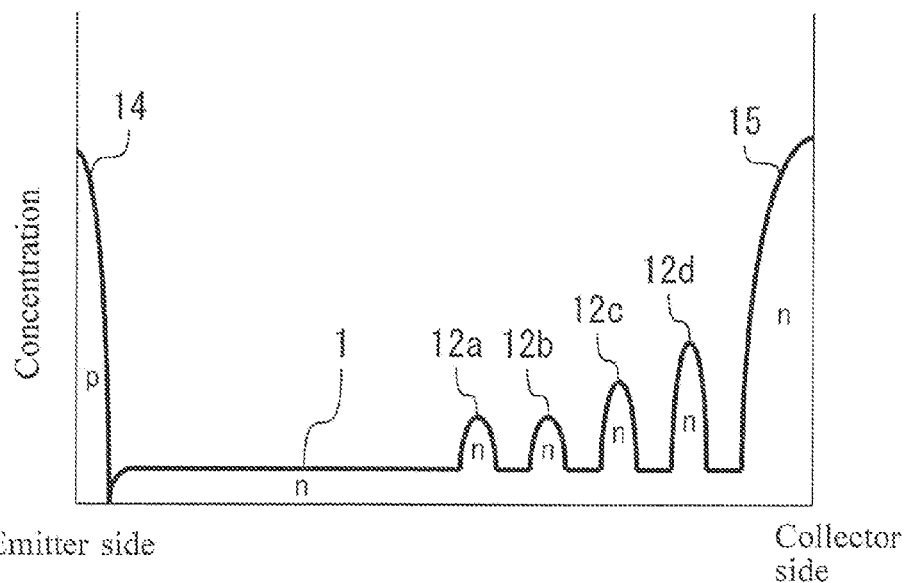
FIG. 29 is a diagram showing an impurity profile.

FIG. 28 is a sectional view of the semiconductor device according to an eleventh embodiment. FIG. 29 is a diagram showing an impurity profile along line K-K' in FIG. 28. The semiconductor device according to the eleventh embodiment of the invention is not an IGBT but a diode. FIG. 28 shows an upper surface layer 14 formed as a p-anode layer and a lower surface layer 15 formed as an $n^+$-cathode layer.

The upper buffer layers 12a and 12b and the lower buffer layers 12c and 12d satisfy Expression 2 below:

Average impurity concentration in first section $a \approx$ average impurity concentration in first section $b \leq$ average impurity concentration in second section $c \leq$ average impurity concentration in second section $d$     Expression 2

In a case where a diode is used as a flywheel diode, ringing can occur in a process in which carriers accumulated in the diode are discharged, called a recovery operation. By forming the buffer layers satisfying Expression 2, however, the risk of allowing oscillation to occur easily at a particular drain voltage equal or lower than the maximum value of the drain voltage at or below which ringing does not occur can be reduced, while the maximum value of the drain voltage is increased.

The buffer layers according to one of the first to tenth embodiments may be formed in the diode. The type of the diode is not particularly specified. For example, a structure including a p-type portion in a back surface process, which is called an RFC diode, may be adopted. A combination of some of the features of the semiconductor devices according to the embodiments described above may be made and used as desired.

According to the present invention, sections uniform in average impurity concentration are formed thick under the drift layer to enable inhibition of ringing at the time of turning off.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising a substrate having an upper surface layer of a second conduction type formed at an upper surface side, a drift layer of a first conduction type formed under the upper surface layer, a buffer layer of the first conduction type formed under the drift layer, and a lower surface layer of the second conduction type formed under the buffer layer, the buffer layer including:
   a plurality of upper buffer layers provided apart from each other; and
   a plurality of lower buffer layers provided apart from each other between the plurality of upper buffer layers and the lower surface layer,
   wherein the plurality of upper buffer layers are formed so that average impurity concentrations in first sections each extending from the upper end of one of the upper buffer layers to the next lower buffer layer are unified as a first concentration;
   the plurality of lower buffer layers are formed so that average impurity concentrations in second sections each extending from the upper end of one of the lower buffer layers to the next lower buffer layer are equal to or higher than the first concentration; and
   the plurality of lower buffer layers are formed so that an average impurity concentration in a lower one of the second sections is equal to or higher than an average impurity concentration in an upper one of the second sections.

2. The semiconductor device according to claim 1, wherein the plurality of upper buffer layers are constituted by two upper buffer layers having peak concentrations equal to each other.

3. The semiconductor device according to claim 1, further comprising a punch-through prevention layer of the first conduction type formed between the buffer layer and the lower surface layer,
   wherein the punch-through prevention layer is in contact with the lower surface layer and has an impurity concentration higher than any of impurity concentrations in the plurality of upper buffer layers and the plurality of lower buffer layers.

4. The semiconductor device according to claim 3, wherein the punch-through prevention layer includes P as an impurity.

5. The semiconductor device according to claim 1, wherein the plurality of upper buffer layers include at least three upper buffer layers having peak concentrations equal to each other.

6. The semiconductor device according to claim 1, wherein each of the thicknesses of the first sections is twice the thickness of the corresponding upper buffer layer.

7. The semiconductor device according to claim 1, wherein peak concentrations in the upper buffer layers are higher than peak concentrations in the lower buffer layers.

8. The semiconductor device according to claim 1, wherein the average impurity concentrations in all the first sections and the average impurity concentrations in all the second sections are equal to each other.

9. The semiconductor device according to claim 1, wherein the first section at the lowermost position in the plurality of first sections and the plurality of second sections are formed so that the average impurity concentration is linearly increased along a direction toward the lower surface layer.

10. The semiconductor device according to claim 9, wherein each of the thicknesses of the first sections is twice the thickness of the corresponding upper buffer layer and each of the thicknesses of the second sections is twice the thickness of the corresponding lower buffer layer.

11. The semiconductor device according to claim 1, wherein the first section at the lowermost position in the plurality of first sections and the plurality of second sections are formed so that the square of the average impurity concentration in one of the sections is the average impurity concentration in the next lower section.

12. The semiconductor device according to claim 1, wherein the plurality of lower buffer layers are successively made thicker according to order of decreasing distance to the lower surface layer.

13. The semiconductor device according to claim 12, wherein each of the plurality of lower buffer layers has a plurality of impurity concentration peaks.

14. The semiconductor device according to claim 1, wherein the plurality of upper buffer layers are constituted by two upper buffer layers, and one of the upper buffer layers on the upper surface layer side is formed thicker than another of the upper buffer layers on the lower surface layer side.

15. The semiconductor device according to claim 14, wherein the impurity concentration in the upper buffer layer on the upper surface layer side is higher than that in the upper buffer layer on the lower surface layer side.

16. The semiconductor device according to claim 1, wherein the impurity concentrations in the plurality of upper buffer layers and the plurality of lower buffer layers are higher than an impurity concentration in the drift layer and is lower than $1E15/cm^3$.

17. The semiconductor device according to claim 1, wherein the upper buffer layer formed closest to the upper surface layer in the plurality of upper buffer layers is formed at a position 10 μm or more deep from the lower surface layer.

18. The semiconductor device according to claim 1, wherein the plurality of upper buffer layers are formed of a proton donor.

19. The semiconductor device according to claim 1, wherein the substrate is formed of a wide-bandgap semiconductor.

20. The semiconductor device according to claim 19, wherein the wide-bandgap semiconductor is silicon carbide, a gallium nitride-based material or diamond.

* * * * *